(12) United States Patent
Munekata et al.

(10) Patent No.: US 7,682,468 B2
(45) Date of Patent: Mar. 23, 2010

(54) LEAD-FREE SOLDER ALLOY

(75) Inventors: Osamu Munekata, Souka (JP); Yoshitaka Toyoda, Satte (JP); Tsukasa Ohnishi, Souka (JP); Minoru Ueshima, Misato (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 11/889,356

(22) Filed: Aug. 10, 2007

(65) Prior Publication Data

US 2008/0061117 A1 Mar. 13, 2008

Related U.S. Application Data

(60) Division of application No. 10/666,129, filed on Sep. 22, 2003, now Pat. No. 7,338,567, which is a continuation of application No. 10/175,149, filed on Jun. 20, 2002, now abandoned.

(30) Foreign Application Priority Data

Jun. 28, 2001 (JP) ............................... 2001-195903

(51) Int. Cl.
*C22C 13/00* (2006.01)
(52) U.S. Cl. .................. 148/400; 420/560; 420/561
(58) Field of Classification Search ............. 148/400; 420/560, 561
See application file for complete search history.

(56) References Cited

U.S. PATENT DOCUMENTS

| | | | |
|---|---|---|---|
| 4,858,816 A | 8/1989 | Gontier | 228/34 |
| 5,817,194 A | 10/1998 | Nagai et al. | 148/400 |
| 5,980,822 A | 11/1999 | Moon et al. | 420/561 |
| 6,179,935 B1 | 1/2001 | Yamashita et al. | 148/400 |
| 7,282,175 B2 | 10/2007 | Amagai et al. | 420/562 |
| 7,335,269 B2 | 2/2008 | Leung | 148/400 |
| 2002/0051728 A1 | 5/2002 | Sato et al. | 420/562 |

FOREIGN PATENT DOCUMENTS

| | | |
|---|---|---|
| DE | 19816671 | 10/1998 |
| EP | 0336575 | 10/1989 |
| EP | 0855242 | 7/1998 |
| EP | 1106301 | 6/2001 |
| JP | 8001373 | 1/1996 |
| JP | 10144718 | 5/1998 |
| JP | 11077366 | 3/1999 |
| JP | 2001-334384 | 12/2001 |
| JP | 2001334384 | * 12/2001 |
| WO | 0103878 | 1/2001 |

OTHER PUBLICATIONS

Patent Abstracts of Japan, vol. 2000, No. 20, Jul. 10, 2001, JP 2001-071173 (Ishikawa Kinzoku KK), Mar. 21, 2001, abstract.
Patent Abstracts of Japan, vol. 2000, No. 04, Aug. 31, 2000, JP 2000-015476 (Ishikawa Kinzoku KK), Jan. 18, 2000, abstract.
Patent Abstracts of Japan, vol. 1998, No. 06, Apr. 30, 1998, JP 10-034376 (Nippon Genma KK), Feb. 10, 1998, abstract.

* cited by examiner

*Primary Examiner*—Sikyin Ip
(74) *Attorney, Agent, or Firm*—Michael Tobias

(57) ABSTRACT

A lead-free solder alloy suitable for use in flow soldering of electronic components to printed wiring boards comprises 0.1-3 wt % of Cu, 0.001-0.1 wt % of P, optionally 0.001-0.1 wt % of Ge, and a balance of Sn. The solder alloy may further contain at least one element of Ag and Sb in a total amount of at most 4 wt %, and/or at least one element of Ni, Co, Fe, Mn, Cr, and Mo in a total amount of at most 0.5 wt % in order to strengthen the alloy, and/or at least one element of Bi, In, and Zn in a total amount of at most 5 wt % in order to lower the melting point of the alloy.

9 Claims, No Drawings

LEAD-FREE SOLDER ALLOY

This application is a divisional of U.S. Patent Application Ser. No. 10/666,129 filed on Sep. 22, 2003, now U.S. Pat. No. 7,338,567, which is a continuation of U.S. Patent Application Ser. No. 10/175,149 filed on Jun. 20, 2002, now abandoned.

BACKGROUND OF THE INVENTION

1. Field of the Invention

This invention relates to a lead-free solder alloy, and particularly to a lead-free solder alloy having excellent solderability when used for soldering electronic components to printed wiring boards by flow soldering.

2. Description of the Related Art

Printed circuit boards are used in a wide range of electrical and electronic equipment including home electrical appliances such as televisions, videos, refrigerators, and air conditioners, as well as office or home electronic equipment such as personal computers, printers, and copying machines. Typically a printed circuit board includes a number of electronic components such as LSI's, IC's, transistors, registers, and capacitors secured to a printed wiring board by soldering.

The solder to be employed for this purpose is selected taking into consideration the various properties and cost of the solder. Solder wettability or solderability on the surfaces of electronic components and printed wiring boards is one of the most important properties of a solder. If soldering is performed with solder having poor wettability, the resulting soldered joints may include soldering defects such as non-wetting, bridges, and voids.

Sn—Pb solders have long been used for soldering electronic components to printed wiring boards due to their low soldering temperatures, good solderability or solder wettability, and low cost. In particular, a 63% Sn—Pb solder, which is called a Sn—Pb eutectic solder or simply a eutectic solder due to its alloy composition near the eutectic composition for Sn—Pb alloys (61.9% Sn—Pb), is used in a wide variety of soldering applications, since it has a narrow solidification temperature range (which is the difference between the liquidus and solidus temperatures of the alloy) and can form reliable soldered joints. (In this specification, unless otherwise specified, the percent of an element in an alloy composition refers to mass percent or "wt %".)

When electrical or electronic equipment is discarded, it is usually disassembled to recover plastic parts such as housings and metallic parts such as chassis for recycling. However, printed circuit boards in the discarded equipment are not suitable for recycling, since they contain both metallic portions and plastic portions combined in a complicated manner. Therefore, in many cases, printed circuit boards removed from disassembled equipment are shredded and buried underground as industrial waste of a stabilized type.

In recent years, however, underground burial of lead-containing wastes including printed circuit boards has become an environmental problem. When the buried lead-containing wastes come into contact with acid rain (rain having a high acidity due to dissolving oxides of sulfur and nitrogen present in the atmosphere), the acid rain can dissolve lead from the wastes, and the dissolved lead can contaminate underground water. There is the concern that such contaminated water may cause lead poisoning if it is drunk by humans for long periods. To eliminate such environmental concerns, there is now a demand in the electronics industries for lead-free solders.

Lead-free solders which have been developed to date are based on Sn and contain one or more additional elements such as Cu, Ag, Bi, and Zn. Typical alloy compositions of lead-free solders are binary alloys such as Sn-0.7% Cu, Sn-3.5% Ag, Sn-58% Bi, and Sn-9% Zn, each having a composition which is the same as or close to the eutectic composition for the binary alloy system. Depending upon the use, additional alloying elements may be added to obtain a ternary or higher alloy.

Each of the above-mentioned lead-free solders has its own problems. For example, a Sn—Zn solder such as a Sn-9% Zn solder has the problem that Zn is highly susceptible to oxidation, resulting in the formation of a thick oxide film on the solder. As a result, wettability becomes poor if soldering is carried out in the air. In addition, when used in flow soldering, a Sn—Zn solder causes the formation of a large amount of dross, which causes difficult problems with respect to practical application of the solder.

With a Sn—Bi solder such as a Sn-58% Bi solder, the formation of dross during flow soldering is not a large problem, but due to the presence of a large proportion of Bi, which has poor ductility, the solder is brittle and has poor mechanical strength. Therefore, soldered joints formed from this solder may not be sufficiently reliable. There is a tendency for the mechanical strength of a Sn—Bi solder to decrease as the proportion of Bi increases.

At present, the lead-free solders which are considered most practical are Sn—Cu solders such as Sn-0.7% Cu, Sn—Ag solders such as Sn-3.5% Ag, and Sn—Ag—Cu solders (e.g., Sn-3.5% Sn-0.6% Cu) in which a small amount of Cu is added to a Sn—Ag solder.

Sn—Cu solders such as Sn-0.7% Cu are inexpensive and their unit cost is comparable to that of conventional Sn—Pb solders. However, they have poor solder wettability.

On the other hand, Sn—Ag solders such as Sn-3.5% Ag and Sn—Ag—Cu solders such as Sn-3.5% Ag-0.6% Cu have relatively good solder wettability, and their mechanical strength is comparable or even superior to that of Sn—Pb solders. Thus, these solders are advantageous in their properties as a solder, but their cost is much higher than that of conventional Sn—Pb solders due to the presence of Ag, which is an expensive metal. If the Ag content in these solders is decreased in order to reduce costs, the wettability and the strength of the solders worsen.

Thus, there is a need for an improved lead-free solder which has the cost advantages of a Sn—Cu solder but has improved properties, and particularly improved wettability.

SUMMARY OF THE INVENTION

The present inventors found that the addition of P (phosphorus) to a Sn—Cu lead-free solder alloy improves the wettability of the solder. Although this effect is obtained when P is added alone, the wettability of the solder can be further improved by the addition of P in combination with Ge (germanium).

According to one form of the present invention, a lead-free solder alloy comprises 0.1%-3% of Cu, 0.001%-0.1% of P, and a balance of Sn. According to another form of the present invention, a lead-free solder alloy comprises 0.1%-3% of Cu, 0.001%-0.1% of P, 0.001%-0.1% of Ge, and a balance of Sn.

The lead-free solder alloy may further contain one or more additional elements which improve the mechanical strength or lower the melting point of the solder in an amount which does not have a significant adverse effect on other properties of the solder.

DETAILED DESCRIPTION OF THE INVENTION

A Sn-based, lead-free solder alloy according to the present invention comprises 0.1%-3% of Cu, 0.001%-0.1% of P, and optionally 0.001%-0.1% of Ge.

The presence of Cu in the solder alloy increases the mechanical strength of the solder. If the Cu content is smaller than 0.1%, Cu has no substantial effect in this respect. If the Cu content is larger than 3%, Cu increases the melting temperature of the solder significantly and reduces solder wettability. Furthermore, when melted to prepare a molten solder bath for use in flow soldering, such a Sn—Cu solder alloy containing more than 3% of Cu causes the formation of a large amount of dross, which makes the soldering operation cumbersome or difficult. Preferably, the Cu content is 0.3%-1.5% and more preferably 0.4%-1.0%.

The addition of P improves the wettability of a Sn—Cu solder. The wettability of the solder can be further improved by the combined addition of P and Ge.

Although it is not desired to be bound by a particular mechanism, it is thought that in a molten state of a solder alloy according to the present invention, P or P and Ge present in the solder are diffused toward the surface of the molten solder and oxidized at the surface to form a thin oxide layer, which serves to shield the surface of the molten solder from direct contact with the atmosphere, thereby preventing the oxidation of the molten solder and improving its wettability. The oxides of P tends to sublimate at the temperature of the molten solder (around 250° C.), while the oxides of Ge tends to remain for an extended time on the surface of the molten solder.

The addition of P or Ge to an Sn—Cu solder in an amount of smaller than 0.001% has no substantial effect on the wettability of the solder.

If P is added in an amount of larger than 0.1%, it forms a molten solder having a viscosity at its surface which is increased to an extent that may interfere with soldering operations, particularly in flow soldering, and cause soldering defects such as bridges, which are short circuits between adjacent soldered joints. Preferably, the P content is 0.001%-0.05% and more preferably 0.001%-0.01%.

Likewise, if the Ge content is larger than 0.1%, soldering operations may be impeded by an increased viscosity of molten solder at its surface. In this case, due to the above-described tendency for Ge to remain for an extended time on the surface, addition of Ge in an amount of more than 0.1% may cause more severe soldering defects such as non-wetting. When added, Ge is preferably present in an amount of 0.001%-0.05% and more preferably 0.002%-0.03%.

In the present invention, the addition of P or the combined addition of P and Ge to a lead-free, Sn—Cu solder is effective in improving wettability, but it does not increase the mechanical strength of the solder alloy. The mechanical strength of a Sn—Cu solder alloy is generally inferior to that of a Sn—Ag or Sn—Ag—Cu solder alloy. Therefore, when it is desired to improve both wettability and mechanical strength, one or more strength-improving elements which are effective in improving the strength of a Sn-based solder alloy can be added to the Sn—Cu—P or Sn—Cu—P—Ge solder alloy according to the present invention.

Examples of such strength-improving elements are Ag, Sb, Ni, Co, Fe, Mn, Cr, and Mo. Each of these elements forms either a solid solution in Sn or an intermetallic compound with Sn in a Sn—Cu-based solder alloy, thereby improving the mechanical strength of the alloy. However, if the content of such elements is too large, they substantially elevate the liquidus temperature of the solder. As a result, the fluidity of molten solder at a given soldering temperature is decreased. For this reason, the total content of Ag and Sb is at most 4%, preferably at most 3.5%, and more preferably at most 3%, and the total content of Ni, Co, Fe, Mn, Cr, and Mo is at most 0.5% and preferably at most 0.3%.

Sn—Cu solders, Sn—Ag solders, and Sn—Ag—Cu solder, which are considered to be promising as lead-free solders, have a melting point which is considerably higher than that of Sn—Pb solders. At present, most electronic components are designed for soldering with Sn—Pb solders. When such electronic components are mounted on a printed wiring board by soldering with one of the above-described higher-melting, lead-free solders, the electronic components may possibly be thermally damaged during soldering so that they cannot operate properly.

In order to eliminate or minimize such thermal damage of electronic components during soldering, a lead-free solder alloy according to the present invention may contain one or more elements for lowering the melting point of a Sn—based solder alloy. Examples of such melting point-lowering elements are Bi, In, and Zn. However, these elements have problems when added in a large amount. Specifically, Bi has poor ductility and can degrade the mechanical strength of a solder alloy, as described previously. Indium (In) and Zn are highly susceptible to oxidation to form oxides, which can interfere with soldering performed near the surface of molten solder such as wave soldering, as previously discussed with respect to P and Ge. Therefore, when added, the total content of Bi, In, and Zn in a lead-free solder alloy according to the present invention is at most 5% and preferably at most 3%.

A lead-free solder alloy according to the present invention can have a wide variety of shapes and forms, which include but are not limited to rods, wires, ribbons, pellets, discs, washers, balls, and other shapes, as well as powders. The powder form of the solder alloy may be used to prepare a solder paste.

Although a lead-free solder alloy according to the present invention may be used in various soldering methods, it is particularly suitable for use in flow soldering which includes wave soldering and dip soldering and which uses a molten solder bath. The lead-free solder alloy is more particularly suitable for use in wave soldering of electronic components to printed wiring boards. In wave soldering, a wave is formed in a molten solder bath by means of a pump and a nozzle, for example, and the surface to be soldered (e.g., the back surface of a printed wiring board on which electronic parts have been placed) is brought into contact with the wave while being traveled in a horizontal direction above the solder bath.

When a lead-free solder alloy according to the present invention is used to perform flow soldering and particularly wave soldering in a continuous process using a molten solder bath, the P content of the solder alloy in the bath may decrease with time due to sublimation of its oxides formed at the surface of the bath as described above. If necessary, the alloy composition may be adjusted during the continuous soldering operation by addition of one or more elements which are insufficient in the bath. The added elements may be in the form of an alloy with other alloying elements.

EXAMPLES

A number of Sn—Cu-based, lead-free solder alloys were prepared by casting and were subjected to tests for evaluating their wettability and bulk strength. The compositions of the solder alloys and the test results are shown in the following table, in which Examples 1 to 7 illustrate solder alloys according to the present invention.

|  | Composition (wt %) | | | | | | | | Properties | |
| --- | --- | --- | --- | --- | --- | --- | --- | --- | --- | --- |
|  | Sn | Cu | P | Ge | Ag | Ni | Bi | Sb | Wettability | Bulk strength (MPa) |
| Example 1 | Bal. | 0.5 | 0.005 |  |  |  |  |  | Excellent | 32 |
| Example 2 | Bal. | 0.7 | 0.01 |  |  |  |  |  | Excellent | 36 |
| Example 3 | Bal. | 0.7 | 0.005 | 0.01 |  |  |  |  | Excellent | 36 |
| Example 4 | Bal. | 0.5 | 0.005 |  | 0.3 |  |  |  | Excellent | 37 |
| Example 5 | Bal. | 0.7 | 0.01 |  |  |  |  | 0.3 | Good | 36 |
| Example 6 | Bal. | 0.7 | 0.003 | 0.01 |  | 0.05 |  |  | Good | 33 |
| Example 7 | Bal. | 0.5 | 0.005 |  | 2 |  | 2 |  | Excellent | 73 |
| Comparative Example 1 | Bal. | 0.7 |  |  |  |  |  |  | Poor | 31 |
| Comparative Example 2 | Bal. | 0.7 |  |  |  |  |  | 0.3 | Poor | 31 |

The wettability of each solder alloy was tested by the wetting balance test (meniscograph method) using a standard testing apparatus for the test. The test pieces used as a substrate to be wetted by a molten solder were Cu plates which measured 0.3 mm thick×10 mm wide×30 mm long and which had been subjected to oxidizing treatment. In the test, after a soldering flux was applied to the surface of a test piece, the test piece was moved downward into a molten bath of the solder alloy to be tested which was maintained at 250° C. and then pulled up from the molten bath while measuring the load placed on the test piece to obtain a curve of wetting force as a function of time. The wettability was evaluated by the zero crossing time on this curve in the following manner:

Excellent: zero crossing time of less than 2 seconds;
Good: zero crossing time of at least 2 seconds and less than 3 seconds;
Poor: zero crossing time of 3 seconds or longer.

The bulk strength of each solder alloy was measured using a test piece of the solder alloy having the shape specified as JIS Z 2201 No. 4 Test Piece. The test piece was prepared by machining a cast bar of the solder alloy. The test piece was subjected to a tensile test using a universal testing machine with a crosshead speed corresponding to approximately 20%/min of the gauge length of the test piece. The maximum stress was recorded as the bulk strength.

As can be seen from the table, each solder alloy according to the present invention has good wettability in spite of being an inexpensive Sn—Cu-based solder, thereby making it possible to perform soldering operations with such a solder in a stable manner.

Although the present invention has been described with respect to preferred embodiments, they are mere illustrative and not intended to limit the present invention. It should be understood by those skilled in the art that various modifications and variations of the embodiments described above can be employed without departing from the scope of the present invention as set forth in the claims.

What is claimed is:

1. A lead-free solder alloy consisting of 0.1-1.5 wt % of Cu, 0.003-0.01 wt % of P, 0.3-3 wt % of Ag, 0-0.1 wt % of Ge, a total of 0-0.5 wt % of at least one of Ni, Co, Fe, Mn, Cr, and Mo, and a balance of Sn.

2. A lead-free solder alloy as claimed in claim 1 containing 0.3-2 wt % of Ag.

3. A lead-free solder alloy as claimed in claim 1 consisting of 0.1-1.5 wt % of Cu, 0.3-2 wt % of Ag, 0.003-0.01 wt % of P, greater than 0 to at most 0.5 wt % of Ni, and a balance of Sn.

4. A lead-free solder alloy as claimed in claim 1 containing 0.001-0.05 wt % of Ge.

5. A soldering method comprising forming a bath of molten solder of the lead-free solder alloy as claimed in claim 1 and contacting an electronic component with the molten solder.

6. A soldering method as claimed in claim 5 wherein the electronic component is disposed on a printed wiring board while contacting the molten solder.

7. A soldering method as claimed in claim 5 including contacting the electronic component with a wave of the molten solder.

8. A lead-free solder alloy as claimed in claim 1 consisting of 0.1-1.5 wt % of Cu, 0.003-0.01 wt % of P, 0.3-3 wt % of Ag, 0-0.01 wt % of Ge, greater than 0 to at most 0.3 wt % of Ni, and a balance of Sn.

9. A lead-free solder alloy as claimed in claim 8 containing 0.5-0.7 wt % of Cu.

* * * * *